US009294101B2

(12) United States Patent
Nonoyama

(10) Patent No.: US 9,294,101 B2
(45) Date of Patent: Mar. 22, 2016

(54) INTEGRATED CIRCUIT, VIBRATING DEVICE, ELECTRONIC APPARATUS, MOVING OBJECT, AND METHOD OF SWITCHING MODES OF INTEGRATED CIRCUIT

(71) Applicant: Seiko Epson Corporation, Tokyo (JP)

(72) Inventor: Mihiro Nonoyama, Chino (JP)

(73) Assignee: Seiko Epson Corporation (JP)

( * ) Notice: Subject to any disclaimer, the term of this patent is extended or adjusted under 35 U.S.C. 154(b) by 91 days.

(21) Appl. No.: 14/034,743

(22) Filed: Sep. 24, 2013

(65) Prior Publication Data

US 2014/0091867 A1 Apr. 3, 2014

(30) Foreign Application Priority Data

Sep. 28, 2012 (JP) ................................. 2012-217441

(51) Int. Cl.
*H03L 1/04* (2006.01)
*H03B 1/02* (2006.01)
*H03L 1/02* (2006.01)

(52) U.S. Cl.
CPC .. *H03L 1/04* (2013.01); *H03B 1/02* (2013.01); *H03L 1/023* (2013.01)

(58) Field of Classification Search
CPC ..................................... H03L 1/04; H03B 1/02
USPC ..................................... 331/70, 176, 185, 186
See application file for complete search history.

(56) References Cited

U.S. PATENT DOCUMENTS

| 5,724,009 | A | 3/1998 | Collins et al. | |
|---|---|---|---|---|
| 8,264,294 | B2* | 9/2012 | Oishi et al. | 331/176 |
| 2003/0014620 | A1* | 1/2003 | Hanjani | 713/1 |
| 2003/0076146 | A1* | 4/2003 | Carragher et al. | 327/291 |
| 2007/0205830 | A1* | 9/2007 | Itagaki et al. | 331/2 |
| 2008/0246549 | A1* | 10/2008 | Chen et al. | 331/185 |
| 2010/0214029 | A1* | 8/2010 | McDonald et al. | 331/18 |
| 2011/0074499 | A1* | 3/2011 | Sako et al. | 327/596 |

\* cited by examiner

*Primary Examiner* — Jeffrey Shin
(74) *Attorney, Agent, or Firm* — Harness, Dickey & Pierce, P.L.C.

(57) ABSTRACT

An oscillator IC includes a VDD terminal (first terminal), an OUT terminal (second terminal), an oscillation circuit for oscillating a resonator element, a mode switching circuit that switches between a normal mode (the first mode in which an oscillation signal output by the oscillation circuit is output from the OUT terminal) and a serial I/F mode (the second mode in which a signal than the oscillation signal is output or input from the OUT terminal) based on a voltage of the VDD terminal, and a control circuit that controls stop of the oscillation circuit in the serial I/F mode based on setting information that can be changed from outside.

14 Claims, 10 Drawing Sheets

INTEGRATED CIRCUIT, VIBRATING DEVICE, ELECTRONIC APPARATUS, MOVING OBJECT, AND METHOD OF SWITCHING MODES OF INTEGRATED CIRCUIT

BACKGROUND

1. Technical Field

The present invention relates to an integrated circuit, a vibrating device, an electronic apparatus, a moving object, and a mode switching method for the integrated circuit.

2. Related Art

Temperature Compensated X'tal Oscillators (TCXOs) are widely used for an apparatus and systems requiring high-accuracy timing signals of terminals and base stations of cellular phones, GPS (Global Positioning System) receivers, etc. because high frequency stability is obtained by cancelling out of deviation (frequency deviation) from a desired frequency (nominal frequency) of an oscillation frequency of a crystal oscillator in a predetermined temperature range.

Generally, for the TCXO, frequency adjustment with respect to each temperature is performed before shipment for temperature compensation of the oscillation frequency. In the adjustment, if the temperature change of the crystal vibrator contained in the TCXO and the detected temperature change of the temperature sensor within the IC for TCXO are relatively equal, high-accuracy temperature compensation can be performed. However, the temperature sensor is often mounted on the IC for TCXO and likely to be affected by heat generation due to consumed power of the IC for TCXO and the heat generation change with the consumed power change of the IC for TCXO affects only the temperature sensor, and thereby, the temperature change of the crystal vibrator and the detection temperature change of the temperature sensor may be unequal and, as a result, high-accuracy temperature compensation is hindered. For the problem, the IC for TCXO in related art has avoided any significant internal state change that causes heat generation change even in a serial I/F mode used for serial communication with an built-in memory or the like.

On the other hand, because of recent price reduction of TCXO, there has been an urgent need to reduce the area and the cost of the IC for TCXO contained in the TCXO, and an IC with the smaller area formed in a microfabrication process has been necessary. Further, the IC for TCXO often has the smaller number of pins for reduction in area and cost, it is hard to provide any dedicated pin for switching to the serial I/F mode used for serial communication with an built-in memory or the like, and thus, the mode switching may be performed by application of a high voltage to a power supply terminal (Patent Document 1 (U.S. Pat. No. 5,724,009)).

However, when a high voltage is applied to the power supply terminal of the IC for TCXO manufactured in the microfabrication process, as a result, the high voltage is applied to a transistor within the IC and stress on the transistor is not negligible, and thereby, characteristic degradation including HCI (Hot Carrier Injection), NBTI (Negative Bias Temperature Instability), TDDB (Time Dependent Dielectric Breakdown) is problematic. For example, NBTI is a phenomenon that, when the state in which there is a potential difference (Negative Bias) between the gate and the substrate of a transistor is held in a long period at a high temperature, the transistor characteristics shift. For example, in the case where an output buffer circuit of an oscillation circuit is formed as shown in FIG. 15, when a high voltage is applied to the power supply terminal (VDD terminal), a voltage difference between the source (S) and the gate (G) of a PMOS transistor within the dotted circle becomes larger, and stress causing NBTI is applied to the transistor. The problem of characteristic degradation hinders the cost reduction by employment of the microfabrication process for the IC for TCXO and makes it difficult to ensure reliability of the device.

SUMMARY

An advantage of some aspects of the invention is to provide an integrated circuit, a vibrating device, an electronic apparatus, a moving object, and a mode switching method for the integrated circuit that can reduce cost using a microfabrication process while reducing stress on a transistor by application of a high voltage at mode switching and maintaining reliability.

The invention can be implemented as the following forms or application examples.

Application Example 1

This application example is directed to an integrated circuit including a first terminal, a second terminal, an oscillation circuit for oscillating a resonator element, a mode switching circuit that switches between a first mode in which an oscillation signal output by the oscillation circuit is output from the second terminal and a second mode in which a signal than the oscillation signal is output or input from the second terminal based on a voltage of the first terminal, and a control circuit that controls stop of the oscillation circuit in the second mode based on setting information.

For example, the first terminal may be a power supply terminal and the mode switching circuit may select the first mode when the voltage of the first terminal is within the first voltage range.

According to the integrated circuit of this application example, switching between the first mode and the second mode may be performed based on the voltage of the first terminal, and stop of the oscillation circuit may be controlled from outside in the second mode. Therefore, by setting to stop the oscillation circuit in the second mode, stress on the elements within the oscillation circuit due to application of a high voltage at mode switching may be reduced and cost may be reduced using the microfabrication process while reliability is maintained.

Application Example 2

The integrated circuit according to the application example described above may be configured such that the control circuit stops the oscillation circuit when power is turned on and the second mode is selected.

According to the integrated circuit of this application example, the oscillation circuit is stopped in the default setting in the second mode, and thus, even when a high voltage is applied to the first terminal, stress on the elements forming the oscillation circuit can be reduced.

Application Example 3

The integrated circuit according to the application example described above may be configured such that the integrated circuit further includes an output buffer circuit to which the oscillation signal output by the oscillation circuit is input and from which the oscillation signal is output to the second terminal, and the control circuit controls stop of the oscillation circuit and the output buffer circuit based on the setting information.

According to the integrated circuit of this application example, both the oscillation circuit and the output buffer circuit are stopped in the second mode, and thus, even when a high voltage is applied to the first terminal, stress on the elements forming the oscillation circuit and the output buffer circuit can be reduced.

Application Example 4

The integrated circuit according to the application example described above may be configured such that the integrated circuit further includes a temperature compensation circuit that has a temperature sensor and performs temperature compensation of a frequency of the resonator element in response to an output signal of the temperature sensor, and the control circuit controls stop of the oscillation circuit and the temperature compensation circuit based on the setting information.

According to the integrated circuit of this application example, both the oscillation circuit and the temperature compensation circuit are stopped in the second mode, and thus, even when a high voltage is applied to the first terminal, stress on the elements forming the oscillation circuit and the temperature compensation circuit can be reduced. On the other hand, when frequency adjustment for temperature compensation of the vibrating device such as an oscillator is performed, by setting both the oscillation circuit and the temperature compensation circuit not to stop in the second mode, the heat generation change can be made smaller and high-accuracy frequency temperature can be realized under a condition that the detection temperature of the temperature sensor and the temperature of the vibrating device are equal.

Application Example 5

The integrated circuit according to the application example described above may be configured such that the integrated circuit further includes a third terminal, and a serial clock signal is input from one of the second terminal and the third terminal and a serial data signal including update data of the setting information is input in synchronization with the serial clock signal from the other of the second terminal and the third terminal in the second mode, and the control circuit acquires the serial data signal in synchronization with the serial clock signal and updates the setting information based on the update data contained in the acquired serial data signal.

For example, in the second mode, the serial clock signal can be input from the third terminal and the serial data signal may be input from the second terminal.

Application Example 6

The integrated circuit according to this application example described above may be configured such that the oscillation circuit outputs a frequency based on a frequency control signal input from the third terminal.

Application Example 7

The integrated circuit according to the application example described above may be configured such that the mode switching circuit selects the first mode when a voltage in a first voltage range is input to the first mode, and selects the second mode when a voltage in a second voltage range different from the first voltage range is input to the first terminal and a pulse signal is input from the second terminal or the third terminal in the first mode.

According to the integrated circuit of this application example, even when the first voltage falls within the first voltage range due to the influence by noise or the like, the mode is not switched from the first mode to the second mode unless the pulse signal is input from the third terminal. Therefore, the possibility of erroneous switching from the first mode to the second mode can be reduced.

Application Example 8

This application example is directed to a vibrating device including any of the integrated circuits described above, and a resonator element that oscillates by the oscillation circuit contained in the integrated circuit.

The vibrating device is an oscillator including a vibrator as the resonator element, a physical quantity sensor including a vibration sensing element as the resonator element, or the like.

According to the vibrating device of this application example, cost can be reduced using the microfabrication process while the reliability is maintained.

Application Example 9

This application example is directed to an electronic apparatus including any of the integrated circuits described above.

Application Example 10

This application example is directed to a moving object including any of the integrated circuits described above.

Application Example 11

This application example is directed to a mode switching method for an integrated circuit including a first terminal, a second terminal, a third terminal, an oscillation circuit for oscillating a resonator element, and a mode switching circuit that switches between a first mode in which an oscillation signal output by the oscillation circuit is output from the second terminal and a second mode in which a signal than the oscillation signal is output or input from the second terminal based on a voltage of the first terminal, wherein a serial clock signal is input from the third terminal in the second mode and the mode switching circuit switches the integrated circuit that selects the first mode when a voltage in a first voltage range is input to the first terminal from the first mode to the second mode, and the method includes setting a voltage of the third terminal to a ground potential or a power supply potential when the voltage in the first voltage range is input to the first terminal, and changing the voltage input to the first terminal from the first voltage range to a second voltage range different from the first voltage range when the voltage of the ground potential or the power supply potential is input to the third terminal.

In the second mode, when the third terminal is at an intermediate potential near a logic threshold value of an internal element, erroneous recognition that the serial clock signal is input from the third terminal can be made. However, according to the mode switching method for the integrated circuit according to the application example, the voltage of the first terminal is changed from the first voltage range to the second voltage range under the condition that the third terminal is set to the ground potential or the power supply potential, and thereby, erroneous operation at switching from the first mode to the second mode can be prevented.

Application Example 12

The mode switching method for the integrated circuit according to the application example described above may be configured such that the method further includes inputting a pulse signal from the third terminal when the voltage input to the first terminal is within the second voltage range, and the mode switching circuit switches the mode to the second mode when the first mode is selected, the voltage in the second voltage range is input to the first terminal, and the pulse signal is input from the third terminal.

According to the mode switching method for the integrated circuit of this application example, even when the first voltage falls within the voltage range due to the influence by noise or the like, the mode is not switched from the first mode to the second mode unless the pulse signal is input from the third terminal. Therefore, the possibility of erroneous switching from the first mode to the second mode can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, embodiments of the invention will be explained with reference to the drawings. Note that the following embodiments do not unduly limit the invention described in the appended claims. Further, every configuration to be explained is not necessarily the essential component element of the invention.

1. Oscillator, Oscillator IC 1-1. First Embodiment

Figure 1:
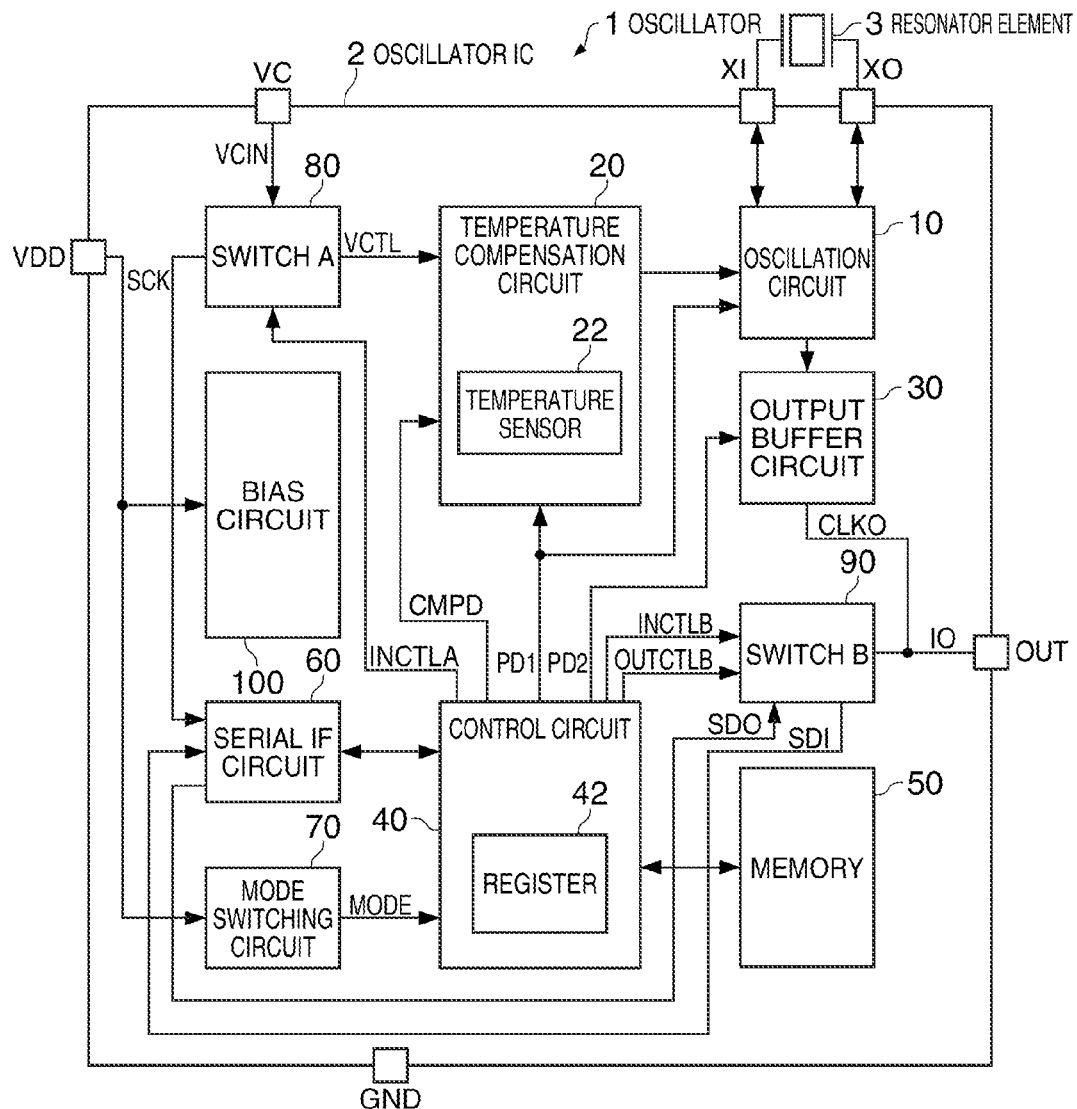
FIG. 1 shows a configuration example of an oscillator of a first embodiment.

FIG. 1 shows a configuration example of an oscillator (an example of a vibrating device) of the first embodiment. As shown in FIG. 1, the oscillator 1 of the first embodiment includes an oscillator IC 2 and a resonator element 3.

The resonator element 3 is connected between an XI terminal and an XO terminal of the oscillator IC 2. As the resonator element 3, for example, an SAW (Surface Acoustic Wave) resonator, an AT-cut crystal resonoator, an SC-cuit crystal resonoator, a tuning-fork type crystal resonoator, and other piezoelectric resonoators and MEMS (Micro Electro Mechanical Systems) reesonoators may be used. As a substrate material for the resonator element 3, a piezoelectric material including piezoelectric single crystal such as crystal, lithium tantalate, and lithium niobate and piezoelectric ceramics such as lead zirconate titanate, a silicon semiconductor material, or the like may be used. As means for exciting the resonator element 3, excitation by the piezoelectric effect may be used or electrostatic driving by coulomb force may be used.

The oscillator IC 2 is an integrated circuit manufactured by a CMOS process or the like for oscillation of the resonator element 3, and includes an oscillation circuit 10, a temperature compensation circuit 20, an output buffer circuit 30, a control circuit 40, a memory 50, a serial interface (IF) circuit 60, a mode switching circuit 70, a switch A (80), a switch B (90), and a bias circuit 100. Note that the oscillator IC 2 of the embodiment may have a configuration in which part of the elements is omitted or changed, or another element is added.

The bias circuit 100 is a circuit that generates various reference voltages from a power supply voltage VDD supplied from a VDD terminal and the respective blocks operate by the power supply voltage VDD and the reference voltages.

The oscillation circuit 10 is a circuit that forms an oscillation loop for amplifying an output signal of the resonator element 3 and inputting the signal to the resonator element 3 using an amplifier element (not shown) such as a MOSFET or a bipolar transistor and oscillates the resonator element 3. In the embodiment, the oscillation circuit 10 includes at least one variable capacity element (not shown) connected to the oscillation loop and is adapted to change the oscillation frequency in response to the voltage applied to the variable capacity element.

The temperature compensation circuit 20 includes a temperature sensor 22 as a thermosensor that generates an output signal having a magnitude changing in response to the temperature, and generates a temperature compensation voltage for cancelling out the frequency fluctuation due to the temperature fluctuation of the resonator element 3 based on the output signal of the temperature sensor 22 and temperature compensation data CMPD (e.g., coefficient values of a frequency-temperature characteristic function of the resonator element 3 of the crystal vibrator or the like) stored in the memory 50 in advance and input via the control circuit 40 and applies the voltage to the variable capacity element of the oscillation circuit 10. Further, the temperature compensation circuit 20 generates a frequency control voltage in response to a frequency control signal VCTL input via the switch A (80) from the VC terminal and applies the voltage to the variable capacity element of the oscillation circuit 10. For example, the temperature compensation circuit 20 may apply a voltage as a sum of the temperature compensation voltage and the frequency control voltage to the single variable capacity element of the oscillation circuit 10, or apply the temperature compensation voltage and the frequency control voltage to the separate variable capacity elements of the oscillation circuit 10. The oscillation circuit 10 oscillates the resonator element 3 at a frequency in response to the temperature compensation voltage and the frequency control voltage. That is, the oscillator 1 of the embodiment is a voltage-controlled temperature-compensated oscillator, and the oscillator IC 2 is an IC for voltage-controlled temperature-compensated oscillator.

The output buffer circuit 30 is a circuit that amplifies and shapes the oscillation signal output from the oscillation circuit 10 to a predetermined level, and outputs a clock signal CLKO. The output of the output buffer circuit 30 is connected to an OUT terminal.

The control circuit 40 is a circuit that controls the operations of the respective blocks, and accesses (reads/writes) the memory 50, performs control of the switch A (80) and the switch B (90) in response to a mode signal MODE, performs control of serial communication via the serial IF circuit 60, performs power-down control of the oscillation circuit 10, the temperature compensation circuit 20, and the output buffer circuit 30, etc. The control circuit 40 includes a register 42 and performs control in response to a set value of the register 42.

The memory 50 is a rewritable nonvolatile memory and realized by an EEPROM (Electrically Erasable Programmable Read-Only Memory) or the like. In the memory 50, data necessary for adjustment of the respective blocks including the temperature compensation data is stored.

The serial IF circuit 60 is a serial communication circuit used for access from outside to the register 42 and the memory 50 in a serial I/F mode, which will be described later. In the serial I/F mode, various kinds of data may be set in the register 42 and the memory 50 from outside and the set values of the register 42 and the memory 50 may be read out to outside via the serial IF circuit 60.

The mode switching circuit 70 is a circuit for switching between a normal mode (an example of the first mode) and the serial I/F mode (an example of the second mode) based on the voltage level of the VDD terminal (an example of the first terminal), and generates the mode signal MODE for identification of the normal mode and the serial I/F mode and supplies the signal to the control circuit 40. The normal mode is a mode in which the frequency control voltage is applied from a VC terminal (an example of the third terminal) and the clock signal CLKO output by the output buffer circuit 30 is output from the OUT terminal (an example of the second terminal) to outside. The serial I/F mode is a mode for using the VC terminal and the OUT terminal for serial communication and, in the embodiment, the VC terminal is used for input of a serial clock signal and the OUT terminal is used for input and output of a serial data signal.

The switch A (80) is a changeover switch circuit that supplies a signal VCIN input from the VC terminal to the temperature compensation circuit 20 as a frequency control signal VCTL in the normal mode and supplies the signal to the serial IF circuit 60 as a serial clock signal SCK in the serial I/F mode.

The switch B (90) is a changeover switch circuit that supplies a serial data output signal SDO from the OUT terminal or supplies a signal input from the OUT terminal as a serial data input signal SDI to the serial IF circuit 60 in the serial I/F mode.

As described above, the oscillator IC 2 of the embodiment has only six external terminals of VDD, GND, XI, XO, VC, OUT, and is not able to prepare a dedicated terminal for switching between the normal mode and the serial I/F mode, a dedicated terminal for input of the serial clock, or a dedicated terminal for input and output of the serial data signal. Accordingly, in the embodiment, the normal mode and the serial I/F mode are switched in response to the voltage level of the VDD terminal, and, in the serial I/F mode, the VC terminal and the OUT terminal are used for input and output of the serial clock signal and the serial data signal.

Figure 2:
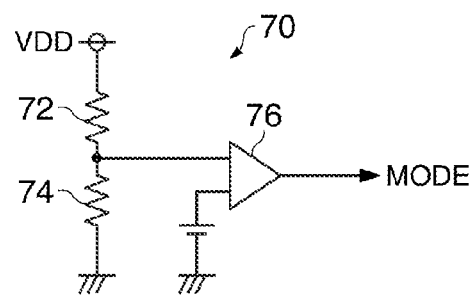
FIG. 2 shows a configuration example of a mode switching circuit in the first embodiment.

FIG. 2 shows a configuration example of the mode switching circuit 70. As shown in FIG. 2, the mode switching circuit 70 includes two resistors 72, 74 and a comparator 76, and a voltage obtained by resistive division of the power supply voltage VDD by the resistors 72, 74 is compared to a voltage for comparison by the comparator 76. The voltage for comparison is generated by the bias circuit 100, for example.

According to the configuration, the mode switching circuit 70 outputs the MODE signal (a low-level signal in the embodiment) representing the normal mode when the power supply voltage VDD is lower than a predetermined voltage VDDR (an example of the first voltage range) and outputs the MODE signal (a high-level signal in the embodiment) representing the serial I/F mode when the power supply voltage VDD is higher than the predetermined voltage VDDR (an example of the second voltage range).

Figure 3:
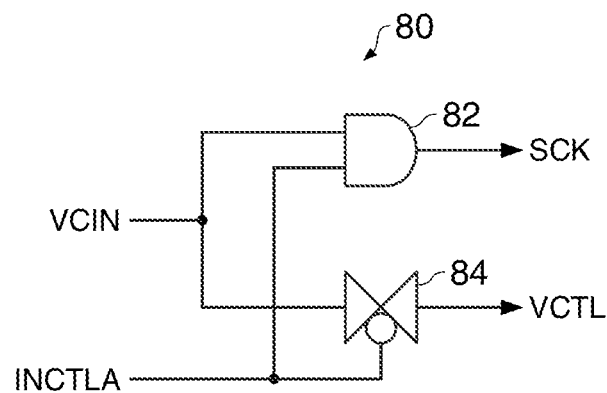
FIG. 3 shows a configuration example of a switch A.

FIG. 3 shows a configuration example of the switch A (80). As shown in FIG. 3, the switch A (80) includes an AND circuit 82 and an analog switch 84.

To the AND circuit 82 and the analog switch 84, an input signal VIN from the VC terminal and an input control signal INCTLA output by the control circuit 40 are input.

The control circuit 40 outputs the input control signal INCTLA at the low level in the normal mode (when the MODE signal is the low-level signal), and outputs the input control signal INCTLA at the high level in the serial I/F mode (when the MODE signal is the high-level signal).

Therefore, in the normal mode, the analog switch 84 is turned on and the input signal VIN is used as the frequency control signal VCTL. On the other hand, in the serial I/F mode, the input signal VIN propagates the AND circuit 82 and is used as the serial clock signal SCK.

Figure 4:
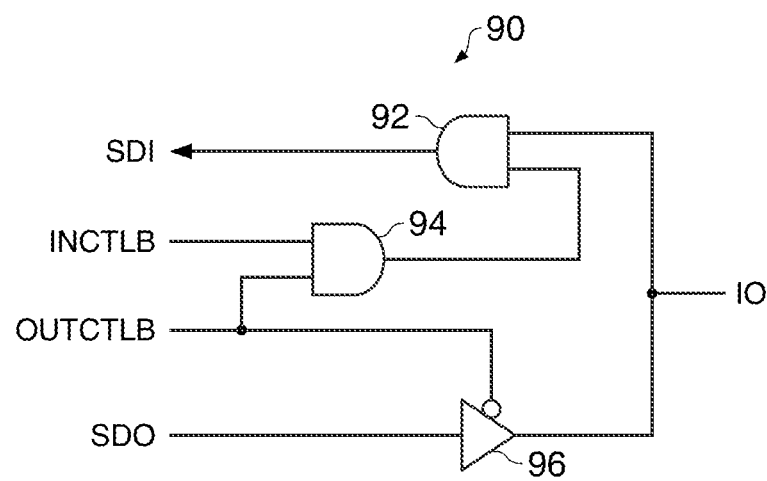
FIG. 4 shows a configuration example of a switch B.

FIG. 4 shows a configuration example of the switch B (90). As shown in FIG. 4, the switch B (90) includes two AND circuits 92, 94 and a three-state buffer 96.

To the AND circuit 94, an input control signal INCTLB and an output control signal OUTCTLB output by the control circuit 40 are input.

The serial data output signal SDO and the output control signal OUTCTLB are input to the three-state buffer 96, and the buffer propagates the serial data output signal SDO to the output when the output control signal OUTCTLB is at the low level and performs high-impedance output when the output control signal OUTCTLB is at the high level.

To the AND circuit 92, the output signal of the AND circuit 94 and the output signal of the three-state buffer 96 are input, and the output signal of the AND circuit 92 is used as the serial data input signal SDI.

The control circuit 40 outputs the output control signal OUTCTLB at the high level in the normal mode (when the MODE signal is the low-level signal). Further, the control circuit 40 outputs the input control signal INCTLB and the output control signal OUTCTLB at a logic level according to an internal sequencer in the serial I/F mode (when the MODE signal is the high-level signal).

Therefore, in the normal mode, the output of the three-state buffer 96 is at the high impedance and the clock signal CLKO is output from the OUT terminal. On the other hand, in the serial I/F mode, the input signal IO from the OUT terminal propagates the AND circuit 92 and is used as the serial data input signal SDI or the serial output signal SDO propagates the three-state buffer 96 and is output from the OUT terminal.

In the embodiment, the control circuit 40 may change whether or not to power down the oscillation circuit 10 and the temperature compensation circuit 20 in the serial I/F mode. The control circuit 40 outputs a power down signal PD1 at the high level for power down and outputs the power down signal PD1 at the low level not for power down to the oscillation circuit 10 and the temperature compensation circuit 20. Whether or not to power down the oscillation circuit 10 and the temperature compensation circuit 20 in the serial I/F mode may be selected by a user depending on whether or not to write "1" to a predetermined bit of the register 42.

Further, the control circuit 40 constantly outputs a power down signal PD2 at the high level to the output buffer circuit 30 and powers down the output buffer circuit 30. Thereby, in the serial I/F mode, the output of the output buffer circuit 30 is constantly at the high impedance, and thereby, the serial data input signal SDI may be input and the serial data output signal SDO may be output from the OUT terminal.

Figure 5A:
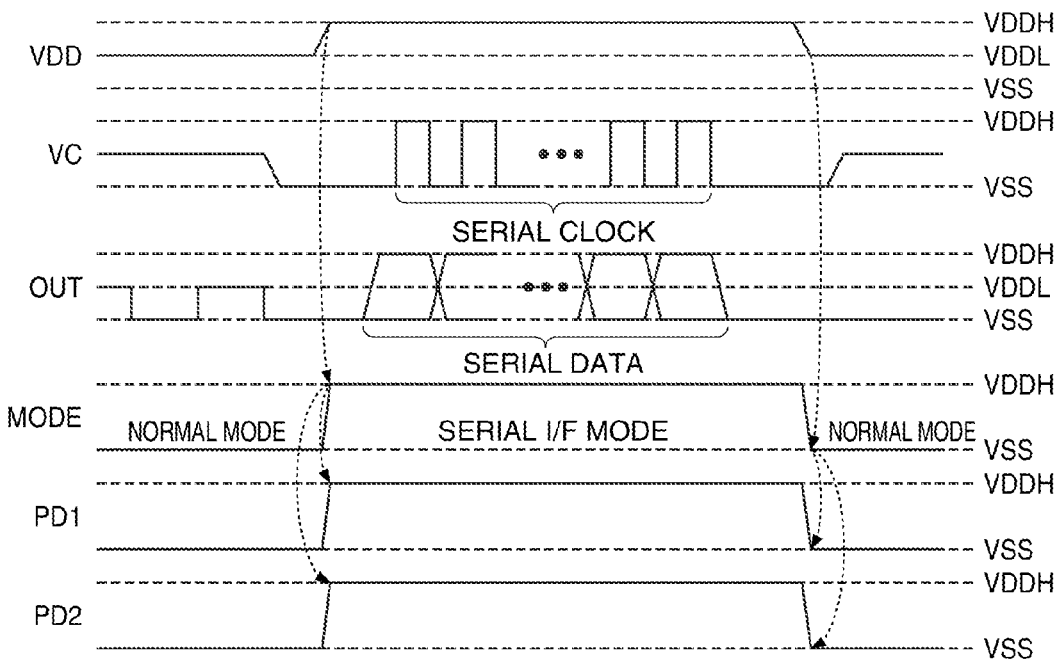
FIGS. 5A and 5B are timing charts showing examples of mode switching in the first embodiment.
Figure 5B:
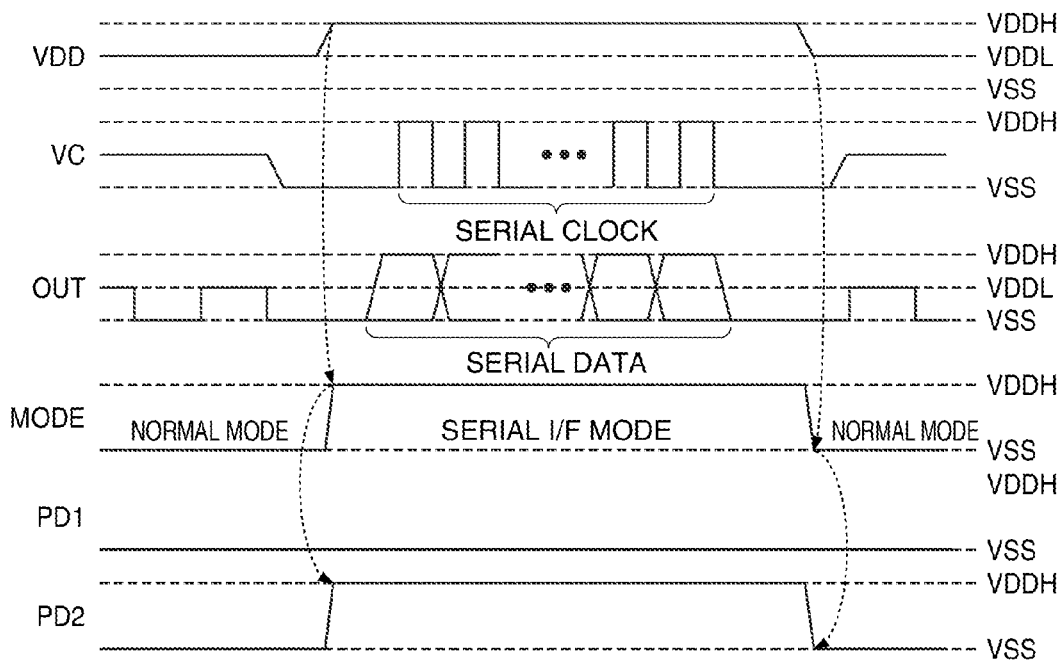

FIGS. 5A and 5B are timing charts showing examples of mode switching. FIG. 5A is the timing chart when a power-down mode (a mode in which the oscillation circuit 10 and the temperature compensation circuit 20 are powered down) is selected in the serial I/F mode, and FIG. 5B is the timing chart when the power-down mode is not selected in the serial I/F mode.

In both of FIGS. 5A and 5B, the mode is switched from the normal mode to the serial I/F mode, and then, further switched from the serial I/F mode to the normal mode. In the normal mode, the power supply voltage VDD is VDDL lower than the predetermined VDDR, and the clock signal CLKO having an amplitude of VDDL is output from the OUT terminal.

In the embodiment, for switching from the normal mode to the serial I/F mode, first, the voltage of the VC terminal is set to VSS (ground potential), and then, with the voltage of the VC terminal remaining VSS, the voltage of the VDD terminal is changed from VDDL to VDDH higher than VDDR. Thereby, the mode is switched to the serial I/F mode. The mode is switched to the serial I/F mode even when the voltage of the VC terminal is not set to VSS, but the voltage of the VDD terminal is changed to VDDH, however, if the voltage of the VC terminal is a voltage near the logic threshold value of the AND circuit 82 shown in FIG. 3, the serial clock SCK may be generated immediately after switching to the serial I/F mode and erroneous operation may be caused. Note that, in the embodiment, the voltage of the VDD terminal is changed to VDDH with the voltage of the VC terminal set to VSS, however, the voltage of the VDD terminal may be changed to VDDH after the voltage of the VC terminal is set to VDDH (power supply potential).

When the mode is switched to the serial I/F mode, in FIG. 5A, both the power-down signal PD1 and the power-down signal PD2 turn to the high level, and the oscillation circuit 10, the temperature compensation circuit 20, and the output buffer circuit 30 are powered down. On the other hand, in FIG. 5B, the power-down signal PD1 remains at the low level and the oscillation circuit 10 and the temperature compensation circuit 20 are not powered down.

In the embodiment, after power is turned on, when the mode is first switched to the serial I/F mode, the power-down mode is set. That is, the power-down mode is set by default in the serial I/F mode. If quitting of the power-down mode is desired, it is necessary to rewrite the setting bit of the register 42 in the serial I/F mode.

Switching from the serial I/F mode to the normal mode is performed by changing the voltage of the VDD terminal from VDDH to VDDL.

When the mode is switched to the normal mode, in FIG. 5A, power down is quitted and the oscillation operation is started, however, the clock signal CLKO is not output from the OUT terminal until the oscillation amplitude exceeds the logic threshold value of the output buffer circuit 30. On the other hand, in FIG. 5B, oscillation continues even in the serial I/F mode, and the clock signal CLKO is output from the OUT terminal immediately after the mode is switched to the normal mode.

Figure 6:
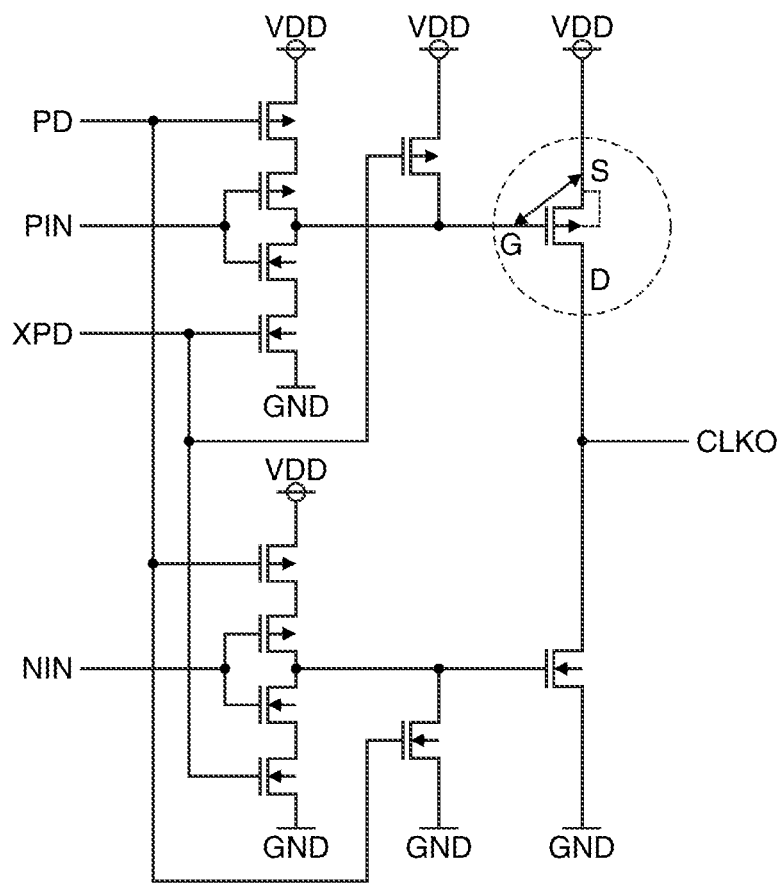
FIG. 6 shows a configuration example of an output buffer circuit.
Figure 15:
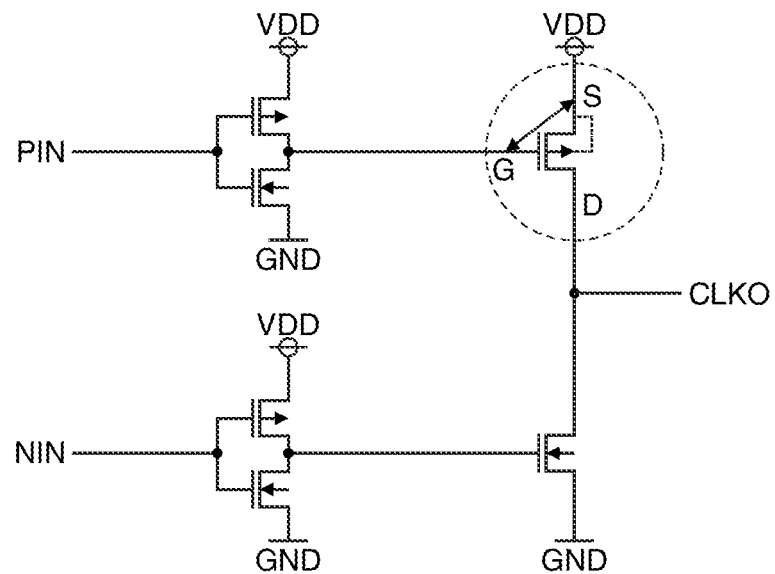
FIG. 15 shows a configuration example of the output buffer circuit of the oscillation circuit in related art.

As described above, according to the oscillator and the oscillator IC of the first embodiment, the power-down mode is set by default in the serial I/F mode, and thus, even if a high voltage is applied to the VDD terminal in the serial I/F mode, stress by the high voltage application may be reduced on the transistors forming the oscillation circuit 10, the temperature compensation circuit 20, and the output buffer circuit 30. Thereby, the cost may be reduced using the microfabrication process while reliability is maintained. For example, if the output buffer circuit 30 is formed as shown in FIG. 6, unlike the case of the configuration in related art (FIG. 15), the voltage difference between the source (S) and the gate (G) of the PMOS transistor within the dotted circle becomes zero even when a high voltage is applied to the VDD terminal, and NBTI stress is not applied.

Further, according to the oscillator and the oscillator IC of the first embodiment, the power-down mode of the oscillation circuit 10 and the temperature compensation circuit 20 may be quitted in the serial I/F mode, and, by quitting the power-down mode, the internal state change of the oscillator IC 2 may be reduced and the temperature change of the oscillator IC 2 may be suppressed. Thereby, for example, when the frequency adjustment step for temperature compensation (the step of creating temperature compensation data) is performed in the final inspection of the oscillator 1 or the like, by quitting the power-down mode in the serial I/F mode, under the condition that the detection temperature of the temperature sensor 22 within the oscillator IC 2 and the temperature of the resonator element 3 are made equal, the frequency adjustment for temperature compensation may be performed with high accuracy.

1-2. Second Embodiment

Switching to the serial I/F mode is necessary before shipment of the oscillator 1, for example, at the frequency adjustment for temperature compensation or the like. However, switching to the serial I/F mode is not necessary after shipment of the oscillator 1, and it should not happen that the mode is erroneously switched to the serial I/F mode at the normal operation and the clock output stops for even a moment. On the other hand, due to a limit on the number of terminals, it may be impossible to use a technique of providing a dedicated terminal for switching to the serial I/F mode and fixing the dedicated terminal to inactive at shipment. Accordingly, an oscillator IC of the second embodiment has a configuration by which the number of terminals is not increased and erroneous switching to the serial I/F mode hardly occurs.

Figure 7:
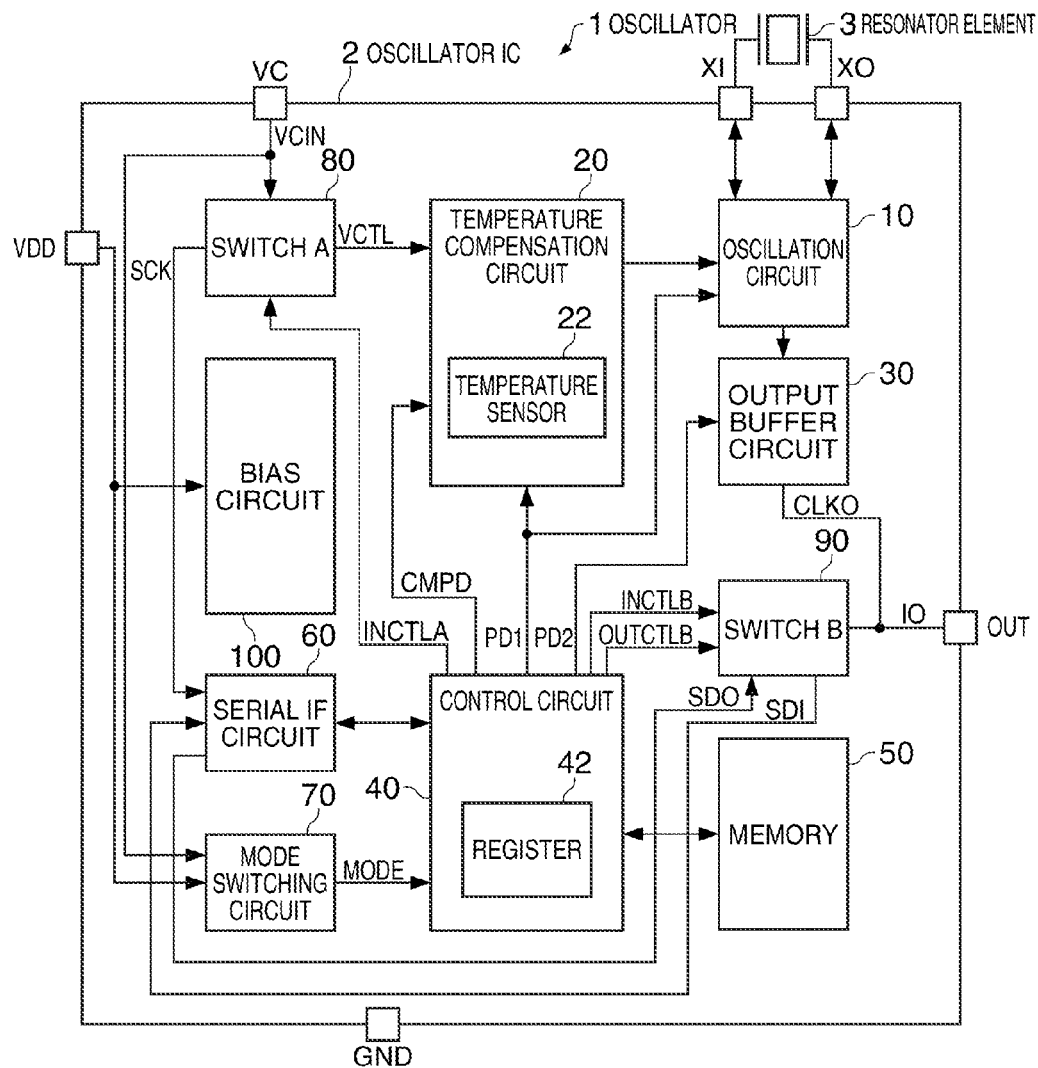
FIG. 7 shows a configuration example of an oscillator of a second embodiment.

FIG. 7 shows a configuration example of an oscillator (an example of the vibrating device) of the second embodiment. As shown in FIG. 7, the component elements of the oscillator 1 of the second embodiment are the same as those of the first embodiment (FIG. 1). Note that the oscillator 1 of the second embodiment is different from the first embodiment in the configuration of the mode switching circuit 70 of the oscillator IC 2.

That is, as shown in FIG. 7, to the mode switching circuit 70 in the embodiment, not only the voltage of the VDD terminal but also the input signal VCIN from the VC terminal is input, and the mode is switched between the normal mode and the serial I/F mode based on the voltage level of the VDD terminal and the input signal VCIN.

Figure 8:
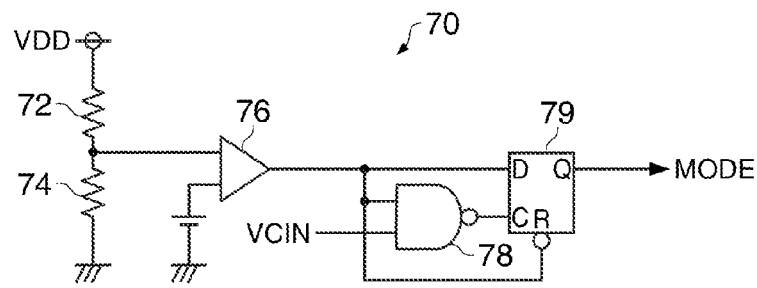
FIG. 8 shows a configuration example of a mode switching circuit in the second embodiment.

FIG. 8 shows a configuration example of the mode switching circuit 70 in the second embodiment. As shown in FIG. 8, the mode switching circuit 70 includes the two resistors 72, 74, the comparator 76, an NAND circuit 78, and a D flip-flop 79 with reset terminal.

Like the first embodiment (FIG. 3), the comparator 76 compares a voltage obtained by resistive division of the power supply voltage VDD by the resistors 72, 74 to a voltage for comparison.

The output signal of the comparator 76 is input to a data input terminal D and a reset terminal R (active low) of the D flip-flop 79 and input to the NAND circuit 78. The input signal VCIN is also input to the NAND circuit 78, and the output signal of the NAND circuit 78 is input to a clock input terminal C of the D flip-flop 79.

Then, a signal output from a data output terminal Q of the D flip-flop 79 is used as the mode signal MODE.

According to the configuration, the mode switching circuit 70 outputs the MODE signal (a low-level signal in the embodiment) representing the normal mode when the power supply voltage VDD is lower than a predetermined voltage VDDR (an example of the first voltage range) and outputs the MODE signal (a high-level signal in the embodiment) representing the serial I/F mode when the power supply voltage VDD is higher than the predetermined voltage VDDR (an example of the second voltage range) and a pulse signal (clock signal) is input as the input signal VCIN at the time of falling of the pulse signal (clock signal).

The rest of the configuration of the oscillator IC 2 of the second embodiment is the same as that of the first embodiment (FIG. 1), and the explanation will be omitted.

Figure 9A:
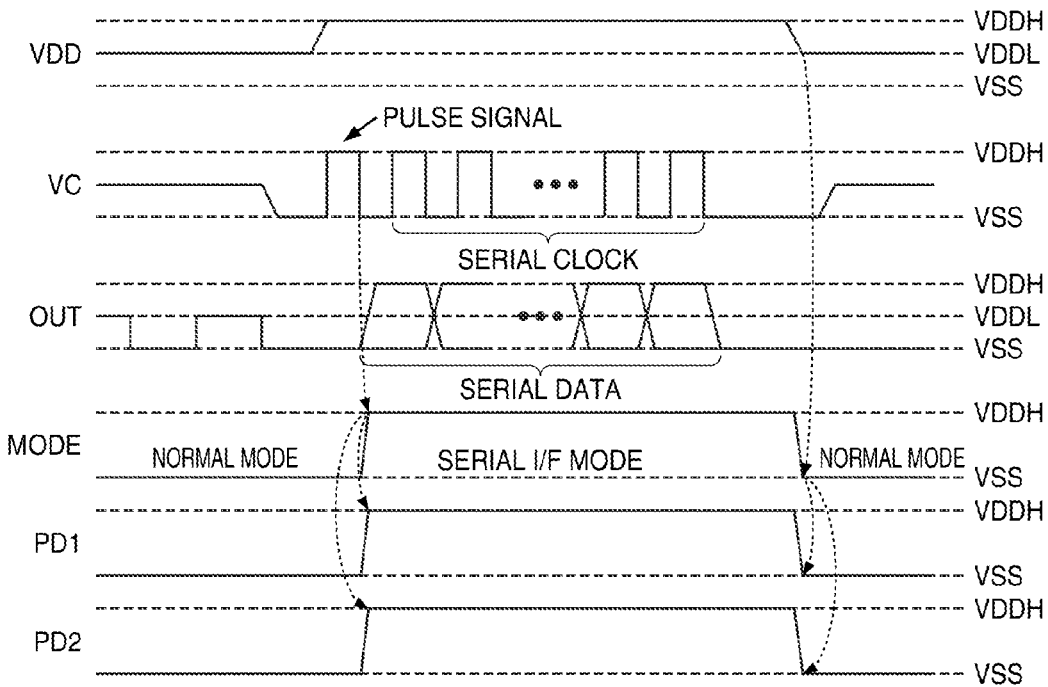
FIGS. 9A and 9B are timing charts showing examples of mode switching in the second embodiment.
Figure 9B:
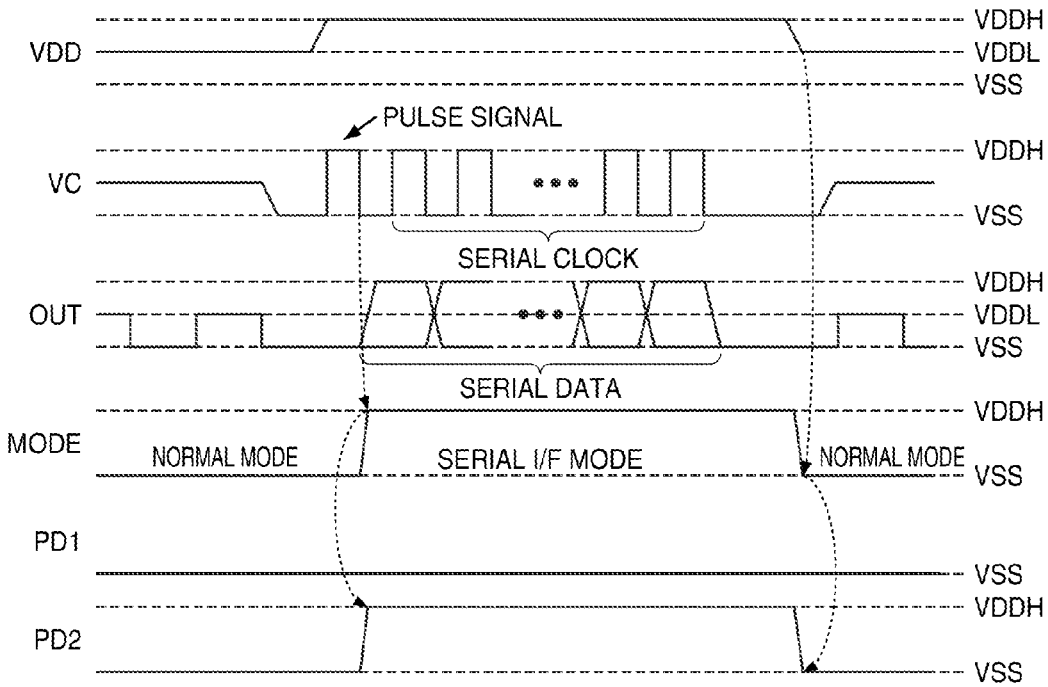

FIGS. 9A and 9B are timing charts showing examples of mode switching in the second embodiment. FIG. 9A is the timing chart when the power-down mode is selected in the serial I/F mode, and FIG. 9B is the timing chart when the power-down mode is not selected in the serial I/F mode.

In both of FIGS. 9A and 9B, the mode is switched from the normal mode to the serial I/F mode, and then, further switched from the serial I/F mode to the normal mode. In the normal mode, the power supply voltage VDD is VDDL lower than the predetermined VDDR, and the clock signal CLKO having an amplitude of VDDL is output from the OUT terminal.

In the embodiment, for switching from the normal mode to the serial I/F mode, as in the first embodiment, first, the voltage of the VC terminal is set to VSS (ground potential), and then, with the voltage of the VC terminal remaining VSS, the voltage of the VDD terminal is changed from VDDL to VDDH higher than VDDR. Further, the pulse signal (clock signal) of VDDH is input to the VC terminal with the voltage of the VDD terminal remaining the VDDH (power supply potential). The mode is switched to the serial I/F mode at falling of the pulse signal (clock signal).

When the mode is switched to the serial I/F mode, in FIG. 9A, both the power-down signal PD1 and the power-down signal PD2 turn to the high level, and the oscillation circuit 10, the temperature compensation circuit 20, and the output buffer circuit 30 are powered down. On the other hand, in FIG. 9B, the power-down signal PD1 remains at the low level and the oscillation circuit 10 and the temperature compensation circuit 20 are not powered down.

Also, in the embodiment, the power-down mode is set by default in the serial I/F mode. If quitting of the power-down mode is desired, it is necessary to rewrite the setting bit of the register 42 in the serial I/F mode.

Switching from the serial I/F mode to the normal mode is performed by changing the voltage of the VDD terminal from VDDH to VDDL as in the first embodiment.

When the mode is switched to the normal mode, in FIG. 9A, power down is quitted and the oscillation operation is started, however, the clock signal CLKO is not output from the OUT terminal until the oscillation amplitude exceeds the logic threshold value of the output buffer circuit 30. On the other hand, in FIG. 9B, oscillation continues even in the serial I/F mode, and thus, the clock signal CLKO is output from the OUT terminal immediately after the mode is switched to the normal mode.

As described above, according to the oscillator and the oscillator IC of the second embodiment, the power-down mode is set by default in the serial I/F mode as in the first embodiment, and thus, stress by the high voltage application may be reduced on the respective transistors. Thereby, the cost may be reduced using the microfabrication process while reliability is maintained.

Further, according to the oscillator and the oscillator IC of the second embodiment, as in the first embodiment, by quitting the power-down mode in the serial I/F mode, the internal state change of the oscillator IC 2 may be reduced and the temperature change of the oscillator IC 2 may be suppressed. Thereby, under the condition that the detection temperature of the temperature sensor 22 within the oscillator IC 2 and the temperature of the resonator element 3 are made equal, the frequency adjustment for temperature compensation may be performed with high accuracy.

Furthermore, according to the oscillator and the oscillator IC of the second embodiment, for switching from the normal mode to the serial I/F mode, it is necessary to input the pulse signal (clock signal) once with a high voltage applied to the VDD terminal, and thus, the possibility of erroneous switching to the serial I/F mode at the normal operation may be reduced.

2. Electronic Apparatus

Figure 10:
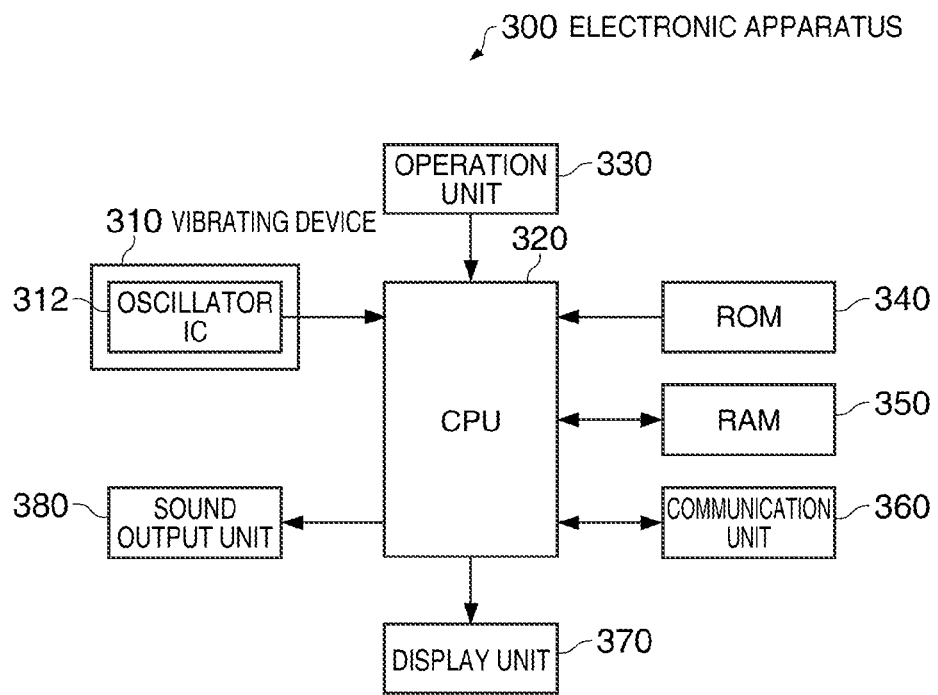
FIG. 10 is a functional block diagram of an electronic apparatus of the embodiment.
Figure 11:
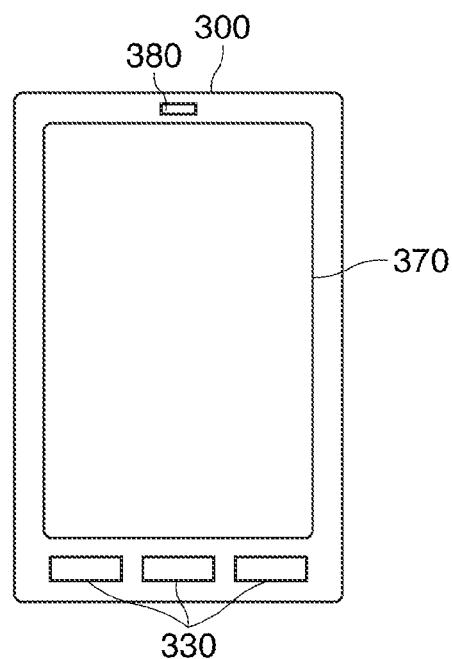
FIG. 11 shows an example of an appearance of the electronic apparatus of the embodiment.

FIG. 10 is a functional block diagram of an electronic apparatus of the embodiment. Further, FIG. 11 shows an example of an appearance of a smartphone as an example of the electronic apparatus of the embodiment.

The electronic apparatus 300 of the embodiment includes a vibrating device 310, a CPU (Central Processing Unit) 320, an operation unit 330, a ROM (Read Only Memory) 340, a RAM (Random Access Memory) 350, a communication unit 360, a display unit 370, and a sound output unit 380. Note that the electronic apparatus of the embodiment may have a configuration in which part of component elements (respective parts) in FIG. 10 is omitted or changed, or another component element is added.

The vibrating device 310 is an oscillator, a vibration sensor, or the like including an oscillator IC 312. As the vibrating device 310 and the oscillator IC 312, the above-described oscillator 1 and the oscillator IC 2 of the respective embodiments may be applied.

The CPU 320 performs various kinds of calculation processing and control processing using signals generated by the vibrating device 310 according to programs stored in the ROM 340 etc. In addition, the CPU 320 performs various kinds of processing in response to operation signals from the operation units 330, processing of controlling the communication unit 360 for data communications with outside, processing of transmitting display signals for display of various kinds of information on the display unit 370, processing of allowing the sound output unit 380 to output various kinds of sound, etc.

The operation unit 330 is an input device including operation keys, button switches, etc. and outputs operation signals in response to the operations by the user to the CPU 320.

The ROM 340 stores programs, data, etc. for the CPU 320 to perform various kinds of calculation processing and control processing.

The RAM 350 is used as a work area of the CPU 320 and temporarily stores the programs and data read out from the ROM 340, the data input from the operation unit 330, and computation results executed by the CPU 320 according to various programs, etc.

The communication unit 360 performs various kinds of control for establishment of data communication between the CPU 320 and an external device.

The display unit 370 is a display device formed using an LCD (Liquid Crystal Display) or the like, and displays various kinds of information based on the display signals input from the CPU 320. In the display unit 370, a touch panel that functions as the operation unit 330 may be provided.

The sound output unit 380 is a device that outputs sound such as a speaker.

By incorporating the oscillator IC 2 of the above-described embodiment as the oscillator IC 312, a more reliable electronic apparatus may be realized.

As the electronic apparatus 300, various kinds of electronic apparatuses may be considered, including, for example, a personal computer (e.g., a mobile personal computer, a laptop personal computer, or a tablet personal computer), a mobile terminal such as a cellular phone, a digital still camera, an inkjet ejection device (e.g., an inkjet printer), a storage area network apparatus such as a router or a switch, a local area network apparatus, a television, a video camera, a video tape recorder, a car navigation system, a pager, a personal digital assistance (with or without communication function), an electronic dictionary, a calculator, an electronic game machine, a game controller, a word processor, a work station, a videophone, a security television monitor, electronic binoculars, a POS terminal, a medical apparatus (for example, an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), a flight simulator, a head mounted display, motion tracing, motion tracking, a motion controller, and PDR (pedestrian dead reckoning).

3. Moving Object

Figure 12:
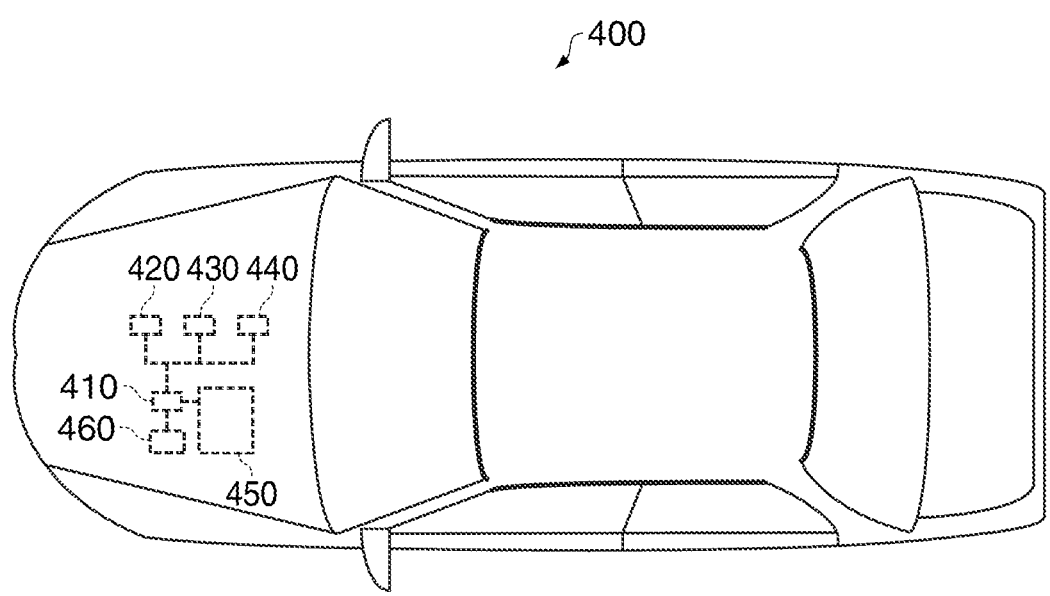
FIG. 12 shows an example of a moving object of the embodiment.

FIG. 12 shows an example of a moving object of the embodiment (in a top view). The moving object 400 shown in FIG. 12 includes an oscillator IC 410, controllers 420, 430, 440 that perform various kinds of control of an engine system, a brake system, a keyless entry system, etc., a battery 450, and a backup battery 460. Note that the moving object of the embodiment may have a configuration in which part of the component elements (respective parts) in FIG. 12 is omitted or changed, or another component element is added.

As the oscillator IC 410, the above-described oscillator IC 2 of the respective embodiments may be applied. Note that the oscillator IC 410 may be replaced by a vibrating device including the oscillator IC 2 (an oscillator, a physical quantity sensor, or the like). The explanation of the other component elements will be omitted, however, high reliability is required for necessary control for traveling of the moving object. For example, the reliability is improved by providing the backup battery 460 in addition to the battery 450.

By applying the above described oscillator IC 2 of the respective embodiments as the oscillator IC 410, the high reliability may be secured.

As the moving object 400, various moving objects may be considered, including, for example, an automobile (including an electric car), an aircraft such as a jet aircraft or a helicopter, a ship, a rocket, and an artificial satellite.

The invention is not limited to the embodiment, but various modifications may be made within the scope of the invention.

For example, in the oscillator 1 of the first embodiment, the output buffer circuit 30 is constantly powered down in the serial I/F mode, however, like the oscillation circuit 10 and the temperature compensation circuit 20, its configuration may be modified for changing whether or not to power down the output buffer circuit 30.

Figure 13:
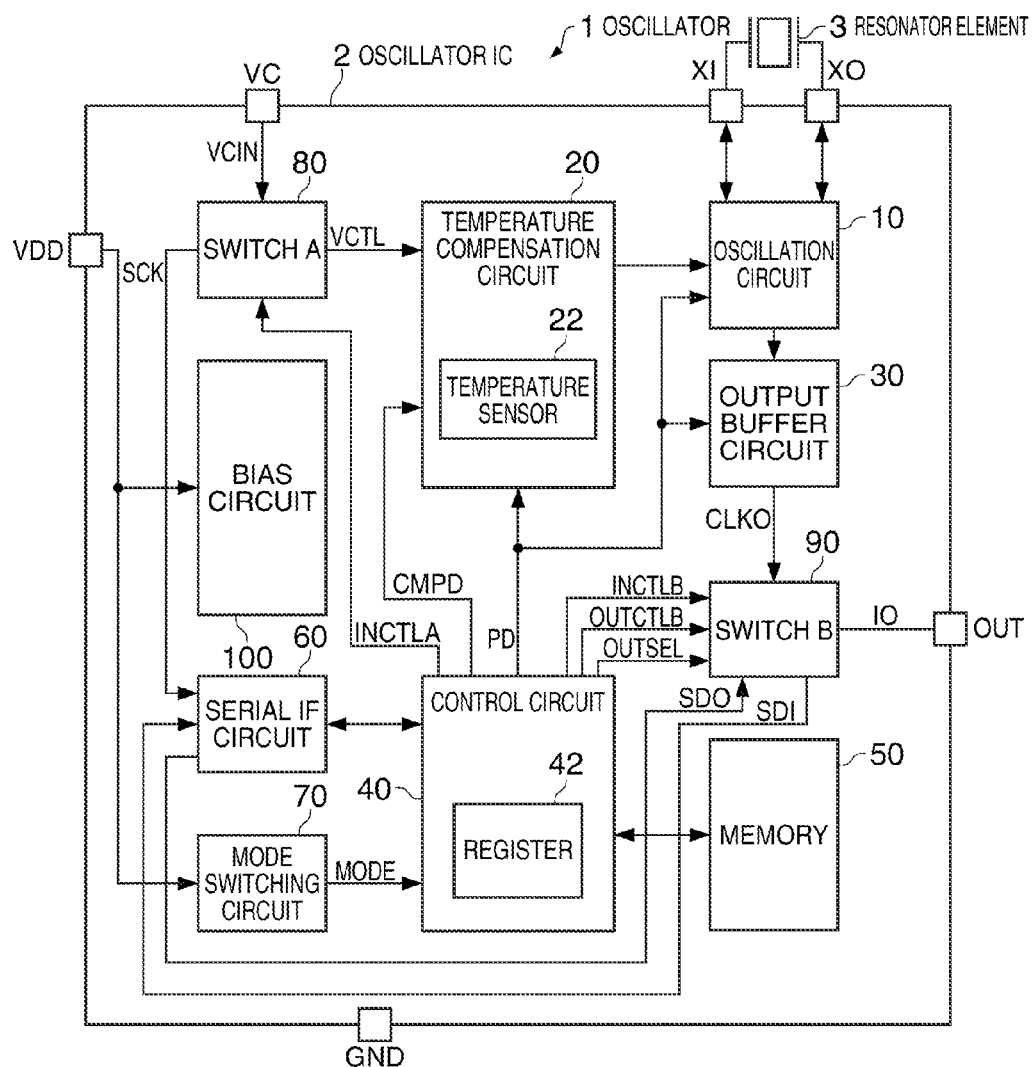
FIG. 13 shows a modified example of the configuration of the oscillator.

FIG. 13 shows a configuration of an oscillator (an example of the vibrating device) of the modified example. As shown in FIG. 13, the component elements of the oscillator 1 of the modified example are the same as those of the first embodiment (FIG. 1). Note that the oscillator 1 of the modified example is different from that of the first embodiment in that the output signal of the output buffer circuit 30 is input to the switch B (90) and in the configuration of the switch B (90) and the configuration of the control circuit 40.

Figure 14:
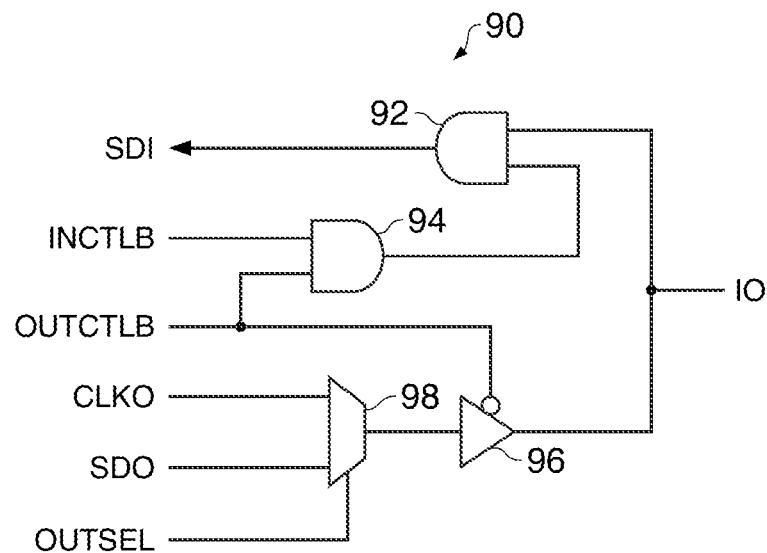
FIG. 14 shows a modified example of the configuration of the switch B.

FIG. 14 shows a configuration example of the switch B (90) in the modified example. As shown in FIG. 14, the switch B (90) includes the two AND circuits 92, 94, a three-state buffer 96, and a selector 98.

To the AND circuit 94, the input control signal INCTLB and the output control signal OUTCTLB output by the control circuit 40 are input.

To the selector 98, the clock signal CLKO output by the output buffer circuit 30, the serial data output signal SDO output by the serial IF circuit 60, and an output selection signal OUTSEL output by the control circuit 40 are input, and the selector selects the clock signal CLKO when the output selection signal OUTSEL is at the low level and selects and output the serial data output signal SDO when the output selection signal OUTSEL is at the high level.

To the three-state buffer 96, the output signal of the selector 98 and the output control signal OUTCTLB are input, and the buffer propagates the output signal of the selector 98 to the output when the output control signal OUTCTLB is at the low level and performs high-impedance output when the output control signal OUTCTLB is at the high level.

To the AND circuit 92, the output signal of the AND circuit 94 and the output signal of the three-state buffer 96 are input, and the output signal of the AND circuit 92 is used as the serial data input signal SDI.

The control circuit 40 outputs the output control signal OUTCTLB at the low level and the output selection signal OUTSEL at the low level in the normal mode (when the MODE signal is the low-level signal). Further, the control circuit 40 outputs the output selection signal OUTSEL at the high level and outputs the input control signal INCTLB and the output control signal OUTCTLB at a logic level according to an internal sequencer in the serial I/F mode (when the MODE signal is the high-level signal).

Therefore, in the normal mode, the clock signal CLKO propagates the selector 98 and the three-state buffer 96 and is output from the OUT terminal. On the other hand, in the serial I/F mode, the input signal IO from the OUT terminal propagates the AND circuit 92 and turns to the serial data input signal SDI or the serial output signal SDO propagates the selector 98 and the three-state buffer 96 and is output from the OUT terminal.

In the modified example, the control circuit 40 may change whether or not to power down the oscillation circuit 10, the temperature compensation circuit 20, and the output buffer circuit 30 in the serial I/F mode. The control circuit 40 outputs a power down signal PD at the high level for power down and outputs the power down signal PD at the low level not for power down to the oscillation circuit 10, the temperature compensation circuit 20, and the output buffer circuit 30. Whether or not to power down the oscillation circuit 10, the temperature compensation circuit 20, and the output buffer circuit 30 in the serial I/F mode may be selected by the user depending on whether or not to write "1" to a predetermined bit of the register 42.

The rest of the configuration of the oscillator IC 2 of the modified example is the same as that of the first embodiment (FIG. 1), and the explanation will be omitted. Further, the timing charts showing examples of mode switching are obtained by deleting PD2 and changing PD1 to PD in the timing charts in FIGS. 5A and 5B of the first embodiment, and their illustration and explanation will be omitted.

According to the oscillator and the oscillator IC of the modified example, the same effect as that of the oscillator of the first embodiment may be exerted.

Note that, in the modified example, in the serial I/F mode, whether or not to power down the output buffer circuit 30 in conjunction with the oscillation circuit 10 and the temperature compensation circuit 20 may be selected, however, whether or not to independently power down the output buffer circuit 30 may be selected. Further, the same applies to the oscillator 1 of the second embodiment, and whether or not to power down the output buffer circuit 30 in conjunction with or independently from the oscillation circuit 10 and the temperature compensation circuit 20 may be changed.

In the above described embodiments and modified examples, the voltage-controlled temperature-compensated oscillator (VC-TCXO or the like) has been explained as an example, however, the oscillator according to the embodiment of the invention may be a temperature-compensated oscillator (TCXO or the like), a voltage-controlled oscillator (VCXO, VCSO, or the like), a oven-controlled oscillator (OCXO or the like), or the like. Further, these oscillators may be piezoelectric oscillators (crystal oscillators or the like), SAW oscillators, silicon oscillators, atomic oscillators regardless of materials of resonator elements and exciting means.

In the above-described embodiments and modified examples, the oscillator as an example of the vibrating device has been explained, however, the vibrating device according to the embodiment of the invention may be a physical quantity sensor (an angular velocity sensor (gyro sensor), an acceleration sensor, or the like) including a vibration sensing element, for example, as long as it includes an oscillator IC (integrated circuit) and a resonator element (vibrator) that oscillates by the oscillator IC.

The above-described embodiments and modified examples are just examples, and the invention is not limited to those. For example, the respective embodiments and modified examples may be appropriately combined.

The invention includes substantially the same configurations (the same configurations in function, method, and result or the same configurations in purpose and advantage) as the configurations explained in the embodiments. Further, the invention includes configurations in which non-essential parts of the configurations explained in the embodiments are replaced. Furthermore, the invention includes configurations that may exert the same effects or achieve the same purposes as those of the configurations explained in the embodiments. In addition, the invention includes configurations formed by adding known technologies to the configurations explained in the embodiments.

The entire disclosure of Japanese Patent Application No. 2012-217441, filed Sep. 28, 2012 is expressly incorporated by reference herein.

What is claimed is:

1. An integrated circuit comprising:
   a first terminal;
   a second terminal;
   an oscillation circuit for oscillating a resonator element;
   a mode switching circuit that switches between a first mode in which an oscillation signal output by the oscillation circuit is output from the second terminal and a second mode in which a signal other than the oscillation signal is output or input from the second terminal based on a voltage of the first terminal;
   a temperature compensation circuit that has a temperature sensor and performs temperature compensation of a frequency of the resonator element in response to an output signal of the temperature sensor, and
   a control circuit that controls stop of the oscillation circuit and the temperature compensation circuit in the second mode based on setting information.

2. The integrated circuit according to claim 1, wherein the control circuit stops the oscillation circuit when power is turned on and the second mode is selected.

3. The integrated circuit according to claim 1, further comprising an output buffer circuit to which the oscillation signal output by the oscillation circuit is input and from which the oscillation signal is output to the second terminal,
   wherein the control circuit controls stop of the oscillation circuit and the output buffer circuit based on the setting information.

4. The integrated circuit according to claim 1, further comprising a third terminal,
   wherein a serial clock signal is input from one of the second terminal and the third terminal and a serial data signal including update data of the setting information is input in synchronization with the serial clock signal from the other of the second terminal and the third terminal, and
   the control circuit acquires the serial data signal in synchronization with the serial clock signal and updates the setting information based on the update data contained in the acquired serial data signal.

5. The integrated circuit according to claim 4, wherein the oscillation circuit outputs a frequency based on a frequency control signal input from the third terminal.

6. The integrated circuit according to claim 4, wherein the mode switching circuit selects the first mode when a voltage in a first voltage range is input to the first mode, and selects the second mode when a voltage in a second voltage range different from the first voltage range is input to the first terminal and a pulse signal is input from the second terminal or the third terminal in the first mode.

7. A vibrating device comprising:
   the integrated circuit according to claim 1; and
   a resonator element that oscillates by the oscillation circuit.

8. A vibrating device comprising:
the integrated circuit according to claim 2; and
a resonator element that oscillates by the oscillation circuit.

9. An electronic apparatus comprising the integrated circuit according to claim 1.

10. An electronic apparatus comprising the integrated circuit according to claim 2.

11. A moving object comprising the integrated circuit according to claim 1.

12. A moving object comprising the integrated circuit according to claim 2.

13. A mode switching method for an integrated circuit including a first terminal, a second terminal, a third terminal, an oscillation circuit for oscillating a resonator element, a mode switching circuit, and a temperature compensation circuit, the mode switching circuit that switches between a first mode in which an oscillation signal output by the oscillation circuit is output from the second terminal and second mode in which a signal other than the oscillation signal is output or input from the second terminal based on a voltage of the first terminal, the temperature compensation circuit includes a temperature sensor and performs temperature compensation of a frequency of the resonator element in response to an output signal of the temperature sensor, wherein a serial clock signal is input from the third terminal in the second mode, and the mode switching circuit switches the integrated circuit that selects the first mode when a voltage in a first voltage range is input to the first terminal from the first mode to the second mode, the method comprising:
setting a voltage of the third terminal to a ground potential or a power supply potential when the voltage in the first voltage range is input to the first terminal; and
changing the voltage input to the first terminal from the first voltage range to a second voltage range different from the first voltage range when the voltage of the ground potential or the power supply potential is input to the third terminal; and
controlling stop of the oscillation circuit and the temperature compensation circuit in the second mode based on setting information.

14. The method according to claim 13, further comprising inputting a pulse signal from the third terminal when the voltage input to the first terminal is within the second voltage range,
wherein the mode switching circuit switches the mode to the second mode when the first mode is selected, the voltage in the second voltage range is input to the first terminal, and the pulse signal is input from the third terminal.

* * * * *